(12) United States Patent
Dasaka et al.

(10) Patent No.: US 10,651,286 B2
(45) Date of Patent: May 12, 2020

(54) HIGH SELECTIVITY NITRIDE REMOVAL PROCESS BASED ON SELECTIVE POLYMER DEPOSITION

(71) Applicants: International Business Machines Corporation, Armonk, NY (US); ZEON CORPORATION, Tokyo (JP)

(72) Inventors: Ravi K. Dasaka, Danbury, CT (US); Sebastian U. Engelmann, White Plains, NY (US); Nicholas C. M. Fuller, North Hills, NY (US); Masahiro Nakamura, Eastchester, NY (US); Richard S. Wise, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/442,933

(22) Filed: Jun. 17, 2019

(65) Prior Publication Data
US 2019/0305109 A1 Oct. 3, 2019

Related U.S. Application Data

(60) Division of application No. 15/462,822, filed on Mar. 18, 2017, now Pat. No. 10,325,998, which is a
(Continued)

(51) Int. Cl.
*H01L 29/66* (2006.01)
*H01L 21/02* (2006.01)
(Continued)

(52) U.S. Cl.
CPC .... *H01L 29/66477* (2013.01); *H01L 21/0206* (2013.01); *H01L 21/0217* (2013.01);
(Continued)

(58) Field of Classification Search
CPC .......... H01L 21/0206; H01L 21/31116; H01L 21/311; H01L 21/3105; H01L 29/6653; H01L 29/6656
See application file for complete search history.

(56) References Cited

U.S. PATENT DOCUMENTS

| 6,120,697 A | 9/2000 | Demmin et al. |
| 6,544,829 B1 | 4/2003 | Gopinath et al. |

(Continued)

OTHER PUBLICATIONS

List of IBM Patents or Patent Applications Treated As Related, Aug. 22, 2019, pp. 1-2.

*Primary Examiner* — David C Spalla
(74) *Attorney, Agent, or Firm* — L. Jeffrey Kelly; Otterstedt, Wallace & Kammer, LLP

(57) ABSTRACT

A silicon nitride cap on a gate stack is removed by etching with a fluorohydrocarbon-containing plasma subsequent to formation of source/drain regions without causing unacceptable damage to the gate stack or source/drain regions. A fluorohydrocarbon-containing polymer protection layer is selectively deposited on the regions that are not to be etched during the removal of the nitride cap. The ability to remove the silicon nitride material using gas chemistry, causing formation of a volatile etch product and protection layer, enables reduction of the ion energy to the etching threshold.

2 Claims, 4 Drawing Sheets

Related U.S. Application Data continuation of application No. 14/615,067, filed on Feb. 5, 2015, now Pat. No. 9,627,533.

(51) Int. Cl.

| | | |
|---|---|---|
| *H01L 21/311* | (2006.01) | |
| *H01L 29/16* | (2006.01) | |
| *H01L 29/161* | (2006.01) | |
| *H01L 29/165* | (2006.01) | |
| *H01L 29/78* | (2006.01) | |

(52) U.S. Cl.
CPC .... *H01L 21/0262* (2013.01); *H01L 21/02381* (2013.01); *H01L 21/02529* (2013.01); *H01L 21/02532* (2013.01); *H01L 21/31116* (2013.01); *H01L 21/31144* (2013.01); *H01L 29/161* (2013.01); *H01L 29/165* (2013.01); *H01L 29/1608* (2013.01); *H01L 29/6653* (2013.01); *H01L 29/6656* (2013.01); *H01L 29/66636* (2013.01); *H01L 29/66795* (2013.01); *H01L 29/7848* (2013.01); *H01L 29/7851* (2013.01)

(56) References Cited

U.S. PATENT DOCUMENTS

| | | | |
|---|---|---|---|
| 6,833,325 | B2 | 12/2004 | Huang et al. |
| 6,890,863 | B1 | 5/2005 | Donohoe et al. |
| 7,718,499 | B2 | 5/2010 | Kim |
| 7,899,637 | B2 | 5/2011 | Yamashita et al. |
| 8,440,575 | B2 | 5/2013 | Taniguchi |
| 9,111,746 | B2 * | 8/2015 | Ranjan ................ H01L 21/0206 |
| 9,627,533 | B2 | 4/2017 | Dasaka et al. |
| 10,269,924 | B2 | 4/2019 | Dasaka et al. |
| 10,325,998 | B2 * | 6/2019 | Dasaka ................ H01L 29/7848 |
| 2006/0091432 | A1 | 5/2006 | Guha et al. |
| 2006/0183308 | A1 | 8/2006 | Zhang et al. |
| 2007/0249112 | A1 | 10/2007 | Geene et al. |
| 2008/0057727 | A1 | 3/2008 | Nanbu |
| 2008/0213549 | A1 | 9/2008 | Lee et al. |
| 2009/0152600 | A1 | 6/2009 | Raghavan et al. |
| 2010/0248487 | A1 | 9/2010 | Lee et al. |
| 2013/0105916 | A1 * | 5/2013 | Chang ................ H01L 29/6653 257/410 |
| 2013/0108833 | A1 | 5/2013 | Brink et al. |
| 2013/0122712 | A1 | 5/2013 | Kim et al. |
| 2014/0220756 | A1 * | 8/2014 | Lutz ................ H01L 29/66545 438/299 |
| 2014/0227869 | A1 | 8/2014 | Reimer et al. |
| 2015/0064812 | A1 | 3/2015 | Patzer et al. |
| 2016/0233335 | A1 | 8/2016 | Dasaka et al. |

* cited by examiner

HIGH SELECTIVITY NITRIDE REMOVAL PROCESS BASED ON SELECTIVE POLYMER DEPOSITION

CROSS-REFERENCE TO RELATED APPLICATION

This application is a divisional of U.S. patent application Ser. No. 15/462,822 filed Mar. 18, 2017, which is in turn a continuation of U.S. patent application Ser. No. 14/615,067 filed Feb. 5, 2015, the complete disclosures of both of which are hereby expressly incorporated herein by reference in their entireties for all purposes.

FIELD

The present disclosure relates to the physical sciences, and, more particularly, to the fabrication of semiconductor devices.

BACKGROUND

The fabrication of field effect transistors (FETs) can involve the formation of a silicon nitride ($Si_3N_4$) cap atop a gate stack including gate electrode and gate dielectric layers. The silicon nitride cap is added to the top of the gate stack during the stack deposition process and must remain sufficiently intact after patterning the same so as to impede epitaxial growth of semiconductor materials at the top of the gate stack during formation of source/drain regions. Silicon germanium (SiGe) and carbon doped silicon (Si:C) are among the materials employed for forming source/drain regions of silicon-based pFET and nFET devices, respectively. Subsequent to formation of source/drain regions, the nitride cap must be fully removed from the gate stack without damaging exposed portions of the source/drain regions. Wafer wide removal can be attempted using conventional chemistries, for example $CH_3F/O_2$ (fluorohydrocarbon) and low ion energy platforms such as the TEL (Tokyo Electron Limited) RLSA (radial line slot antenna) and Lam Research KIYO® conductor etch system. A fluorohydrocarbon plasma employed for anisotropic etching of silicon nitride is selective to silicon oxide. Selectivity to silicon, while not inherent, is based on the formation of silicon oxide on silicon, thereby preventing further erosion of the silicon. High selectivity to silicon at the nanoscale level is not obtained using such technology. The removal of the nitride cap while avoiding damage to the gate and/or the source/drain regions in an efficient and effective manner is a goal of those in the semiconductor processing industry.

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged.

SUMMARY

Principles of the present disclosure provide an exemplary fabrication method that includes obtaining a FET structure comprising a semiconductor substrate, a gate stack on the substrate, source/drain regions operatively associated with the gate stack, and a silicon nitride cap of the gate stack. The method further includes generating a fluorohydrocarbon-containing plasma selective to silicon by decomposition of $C_xH_yF_z$ wherein x is an integer selected from 3, 4, 5 and 6, y and z are positive integers, and y is greater than z. The silicon nitride cap is etched anisotropically by employing the fluorohydrocarbon-containing plasma to form a first hydrofluorocarbon polymer layer having a first thickness on the source/drain regions and a second hydrofluorocarbon polymer layer having a second thickness on the silicon nitride cap, the first thickness being greater than the second thickness, the second hydrofluorocarbon polymer layer further comprising a volatile nitrogen-containing compound formed by interaction of the fluorohydrocarbon-containing plasma with the silicon nitride comprising the silicon nitride cap.

An exemplary structure includes a semiconductor substrate, a gate stack on the substrate, a channel region beneath the gate stack, spacers adjoining the gate stack, and source/drain regions operatively associated with the gate stack and channel region, the source/drain regions having top surfaces. A fluorohydrocarbon-containing polymer layer directly contacts the top surfaces of the source/drain regions and covers the source/drain regions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Fabrication methods as disclosed herein can provide substantial beneficial technical effects. For example, one or more embodiments may provide one or more of the following advantages:

High selectivity nitride gate cap removal;
Avoidance of damage to source/drain regions and gate stack;
Reduction of required ion energy to the etching threshold by chemical removal of the nitride gate cap;
High macro-to-macro and wafer-wide uniformity ensuring quasi-ideal device characteristics;
Very low CD (critical dimension) bias (litho→final);
Lower substrate temperature processing range.

These and other features and advantages will become apparent from the following detailed description of illustrative embodiments thereof, which is to be read in connection with the accompanying drawings.

DETAILED DESCRIPTION

Figure 1:
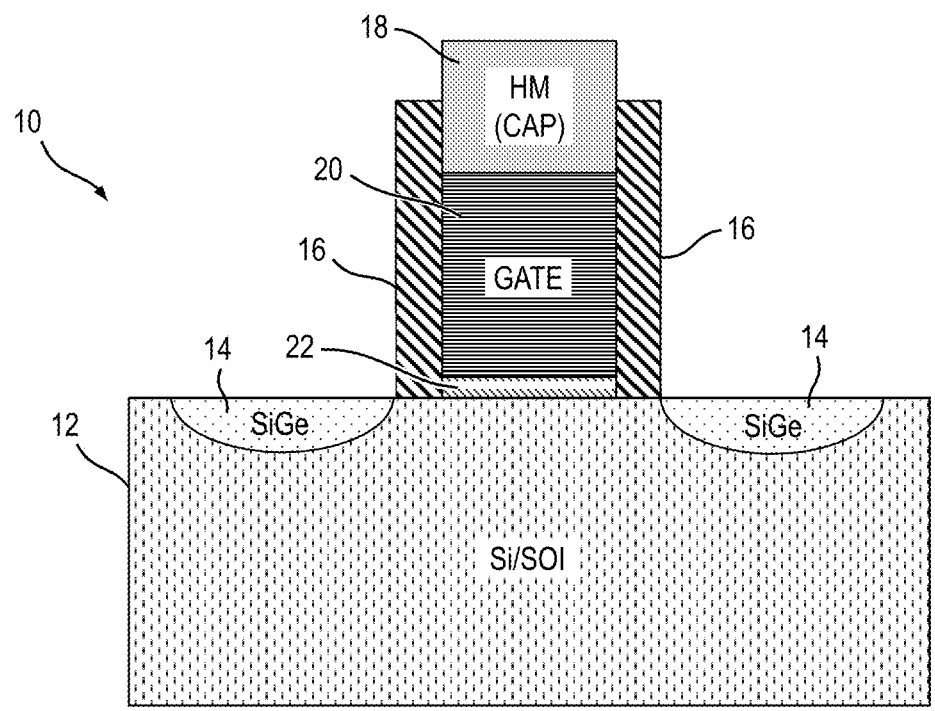
FIG. 1 is a schematic illustration of a FET structure including a gate stack and operatively associated source/drain regions.

An anisotropic silicon nitride etch provides selectivity to silicon by forming a fluorohydrocarbon-containing polymer on silicon surfaces. Selective fluorohydrocarbon deposition is employed to provide selectivity to non-nitride surfaces. The fluorohydrocarbon-containing polymer interacts with silicon nitride to form a volatile compound, thereby enabling etching of silicon nitride. The fluorohydrocarbon-containing polymer does not interact with silicon, and protects silicon-based source/drain regions from the plasma. The anisotropic silicon nitride etch can be employed to etch silicon nitride selective to silicon and silicon oxide in any dimension, including small dimensions less than fifty nm. The processes discussed below are applicable to fabrication of nFET and pFET structures. FIGS. 1-2 illustrate exemplary structures that may be obtained sequentially in fabricating a structure, it being appreciated that additional steps are performed to obtain the structure shown in FIG. 1 and that further steps are performed in some embodiments once the structure shown in FIG. 2 has been obtained. The drawings are not necessarily to scale.

FIG. 1 shows a FET structure 10 including a semiconductor substrate 10, which in some embodiments is a monocrystalline silicon layer formed on an electrically insulating layer (not shown) source/drain regions 14 formed within the substrate 10, and a gate stack operatively associated with the source/drain regions 14. The region of the substrate 10 beneath the gate stack forms a channel region. The gate stack is adjoined by spacers 16. The spacers 16 comprise multiple layers of electrically insulating materials in some embodiments. A cap 18 adjoins the top surface of the gate stack. The cap on the gate stack includes silicon nitride. The silicon nitride can be stoichiometric having an atomic ratio of 3:4 between silicon and nitrogen, or can be non-stoichiometric.

Gate stacks can be fabricated, for example, by forming a stack including a gate dielectric layer 22 and a gate conductor layer 20 on a portion of the substrate suitable for use as a channel. The sidewalls of the gate dielectric 22, the gate electrode or conductor 20, and the gate cap 18 can be vertically coincident, i.e., coincide among one another in a top down view, i.e., a view from above in a direction perpendicular to the horizontal plane between the semiconductor material portion 12 and the gate dielectric layer 22. In the exemplary embodiment shown in FIG. 1, the cap 18 extends within the area defined by the spacers 16 and above the top surface of the spacers 16.

Gate stacks including the gate dielectric layer 22 and gate conductor layer 20 are formed in one or more embodiments using a gate first integration scheme as known in the art. In such embodiments, the gate stack and nitride cap are formed prior to formation of the source/drain regions, which are then deposited epitaxially in some embodiments. Chemical vapor deposition (CVD) is one technique for epitaxially depositing layers of SiGe and Si:C. The silicon nitride cap 18 impedes epitaxial growth of such materials during epitaxial formation of the source/drain regions, which may be either n-type or p-type, the opposite conductivity type of the associated channel beneath the gate dielectric layer 22. The source/drain regions may comprise other materials, such as Group III-V semiconductor materials, in some embodiments. The structure 10 as schematically illustrated in FIG. 1 is obtained in some embodiments. It will be appreciated that other transistor structures may alternatively be obtained. For example, the source/drain regions 14 are raised in some embodiments with respect to the dielectric layer 22.

Referring to FIG. 1, the exemplary structure 10 is placed into a process chamber configured for a plasma etch, i.e., a reactive ion etch. An anisotropic etch employing a fluorohydrocarbon-containing plasma is performed on the exemplary structure. The composition of the gas supplied into the process chamber includes one or more compositions of $C_xH_yF_z$, wherein x is an integer selected from 3, 4, 5, and 6, y and z are positive integers, and y is greater than z. For example, the fluorohydrocarbon gas employed in the present disclosure can include one or more of $C_3H_5F_3$, $C_3H_6F_2$, $C_3H_7F$, $C_3H_4F_2$, $C_3H_5F$, $C_3H_3F$, $C_4H_6F_4$, $C_4H_7F_3$, $C_4H_8F_2$, $C_4H_9F$, $C_4H_5F_3$, $C_4H_6F_2$, $C_4H_7F$, $C_4H_4F_2$, $C_4H_5F$, $C_5H_7F_5$, $C_5H_8F_4$, $C_5H_9F_3$, $C_5H_{10}F_2$, $C_5H_{11}F$, $C_5H_6F_4$, $C_5H_7F_3$, $C_5H_8F_2$, $C_5H_9F$, $C_5H_5F_3$, $C_5H_6F_2$, $C_5H_7F$, $C_6H_8F_6$, $C_6H_9F_5$, $C_6H_{10}F_4$, $C_6H_{11}F_3$, $C_6H_{12}F_2$, $C_6H_{13}F$, $C_6H_7F_5$, $C_6H_8F_4$, $C_6H_9F_3$, $C_6H_{10}F_2$, $C_6H_{11}F$, $C_6H_6F_4$, $C_6H_7F_3$, $C_6H_8F_2$, and $C_6H_9F$. Correspondingly, the fluorohydrocarbon-containing plasma includes ions of $C_xH_yF_z$. Optionally, the composition of the gas supplied into the process chamber can further include $O_2$, CO, $CO_2$, $N_2$, Ar, $H_2$, He or combinations thereof. In other words, the fluorohydrocarbon-containing plasma optionally includes a plasma of $O_2$, CO, $CO_2$, $N_2$, Ar, $H_2$, He or combinations thereof in addition to the plasma of $C_xH_yF_z$. US 2013/0105916, which is incorporated by reference herein, describes these and other fluorohydrocarbon gases that may be employed to provide selectivity to non-nitride surfaces.

Non-limiting specific examples of $C_xH_yF_z$, wherein x is an integer selected from 3, 4, 5, and 6, y and z are positive integers, and y is greater than z, include alkanes, alkenes, and alkynes.

In one embodiment, the fluorohydrocarbon gas can include one or more alkane fluorohydrocarbon gas having the formula of $C_xH_yF_z$, wherein x is an integer selected from 3, 4, and 5, y and z are positive integers, and y is greater than z. The one or more alkane fluorohydrocarbon gas can include, but are not limited to: saturated liner fluorohydrocarbons shown by $C_3H_7F$ such as 1-fluoropropane, 2-fluoropropane; saturated liner fluorohydrocarbons shown by $C_3H_6F_2$ such as 1,1-difluoropropane, 2,2-difluoropropane, 1,2-difluoropropane, 1,3-difluoropropane; saturated liner fluorohydrocarbons shown by $C_3H_5F_3$ such as 1,1,1-trifluoropropane, 1,1,2-trifluoropropane, 1,1,3-trifluoropropane, 1,2,2-trifluoropropane; saturated cyclic fluorohydrocarbon shown by $C_3H_5F$ such as fluorocyclopropane; saturated cyclic fluorohydrocarbon shown by $C_3H_4F_2$ such as 1,2-difluorocyclcoproapne; saturated liner fluorohydrocarbons shown by $C_4H_9F$ such as 1-fluorobutane, 2-fluorobutane; saturated liner fluorohydrocarbons shown by $C_4H_8F_2$ such as 1-fluoro-2-methylpropane, 1,1-difluorobutane, 2,2-difluorobutane, 1,2-difluorobutane, 1,3-difluorobutane, 1,4-difluorobutane, 2,3-difluorobutane, 1,1-difluoro-2-methylpropane, 1,2-difluoro-2-methylpropane, 1,3-difluoro-2-methylpropane; saturated liner fluorohydrocarbons shown by $C_4H_7F_3$ such as 1,1,1-trifluorobutane, 1,1,1-trifluoro-2-methylpropane, 1,1,2-trifluorobutane, 1,1,3-trifluorobutane, 1,1,4-trifluorobutane, 2,2,3-trifluorobutane, 2,2,4-trifluorobutane, 1,1,2-trifluoro-2-methylpropane; saturated liner fluorohydrocarbons shown by $C_4H_6F_4$ such as 1,1,1,2-tetrafluorobutane, 1,1,1,3-tetrafluorobutane, 1,1,1,4-tetrafluorobutane, 1,1,2,2-tetrafluorobutane, 1,1,2,3-tetrafluorobutane, 1,1,2,4-tetrafluorobutane, 1,1,3,3-tetrafluroobutane, 1,1,3,4-tetrafluorobutane, 1,1,4,4-tetrafluorobutane, 2,2,3,3-tetrafluorobutane, 2,2,3,4-tetrafluorobutane, 1,2,3,4-tetrafluorobutane, 1,1,1,2-tetrafluoro-2-methylpropane, 1,1,1,3-tetrafluoro-2-methylpropane, 1,1,2,3-tetrafluoro-2-methylpropane, 1,1,3,3-tetrafluoro-2-methylpropane; saturated cyclic fluorohydrocarbon shown by $C_4H_7F$ such as fluorocyclobutane; saturated cyclic fluorohydrocarbons shown by $C_4H_6F_2$ such as 1,1-difluorocyclobutane, 1,2-difluorocyclobutane, 1,3-difluorocyclobutane; saturated cyclic fluorohydrocarbon shown by $C_4H_5F_3$ such as 1,1,2-trifluorocyclobutane, 1,1,3-triflurocyclobutane; saturated liner fluorohydrocarbons shown by $C_5H_{11}F$ such as 1-fluoropentane, 2-fluoropentane, 3-fluoropentane, 1-fluoro-2-methylbutane, 1-fluoro-3-methylbutane, 2-fluoro-3-methylbutane, 1-fluoro-2,2-dimethylpropane; saturated liner fluorohydrocarbons shown by $C_5H_{10}F_2$ such as 1,1-difluoropenatne, 2,2-difluoropentane, 3,3-difluoropentane, 1,2-difluoropentane, 1,3-difluoropentane, 1,4-difluoropentane, 1,5-difluoropentane, 1,1-difluoro-2-methylbutane, 1,1-difluoro-3-methylbutane, 1,2-difluoro-2-methylbutane, 1,2-difluoro-3-methylbutane, 1,3-difluoro-2-methylbutane, 1,3-difluoro-3-methylbutane, 1,4-difluoro-2-methylbutane, 2,2-difluoro-3-methylbutane, 2,3-difluoro-2-methylbutane, 1,1-difluoro-2,2-dimethylpropane, 1,3-difluoro-2,2-dimethylproapne, 1-fluoro-2-fluoromethylbutane; saturated liner fluorohydrocarbons shown by C5H9.3 such as 1,1,1-trifluoropentane, 1,1,2-trifluoropentane, 1,1,3-trifluoropentane, 1,1,4-trifluoropentane, 1,1,1-trifluoro-2-methylbutane, 1,1,2-trifluoro2,3-dimethylpropane; saturated cyclic fluorohydrocarbons shown by $C_5H_9F$ such as fluorocyclopentane, 1-fluoro-2-methylcyclobutane, 1-fluoro-3-methylcyclobutane, (fluoromethyl)-cyclobutane; saturated cyclic fluorohydrocarbons shown by $C_5H_8F_2$ such as 1,2-difluorocyclopentane, 1,3-difluorocyclopentane, 1,1-difluoro-2-methylcyclobutane, 1,1-difluoro-3-methylcyclobutane; saturated cyclic fluorohydrocarbons shown by $C_5H_7F_3$ such as 1,1,2-trifluorocyclopentane and 1,2,3,trifluorocyclopentane.

Additionally or alternatively, the fluorohydrocarbon gas can include one or more alkene fluorohydrocarbon gas having the formula of $C_xH_yF_z$, wherein x is an integer selected from 3, 4, and 5, y and z are positive integers, and y is greater than z. The one or more alkene fluorohydrocarbon gas can include, but are not limited to: unsaturated liner fluorohydrocarbons shown by $C_3H_5F$ such as 3-fluoropropene, 1-fluoropropene, 2-fluoropropene; unsaturated liner fluorohydrocarbons shown by $C_3H_4F_2$ such as 1,1-difluoropropene, 3,3-difluoropropene; unsaturated cyclic fluorohydrocarbons shown by $C_3H_3F$ such as 3-fluorocyclopropene, 1-fluorocyclopropene; unsaturated liner fluorohydrocarbons shown by $C_4H_7F$ such as 1-fluorobutene, 2-fluorobutene, 3-fluorobutene, 4-fluorobutene, 1-fluoro-2-butene, 2-fluoro-2-butene, 1-fluoro-2-methylpropene, 3-fluoro-2-methylpropene, 2-(fluoromethyl)-propene; unsaturated liner fluorohydrocarbons shown by $C_4H_6F_2$ such as 1,1-difluoro-2-methylpropene, 3,3-difluoro-2-methylpropene, 2-(fluoromethyl)-fluoropropene, 3,3-difluorobutene, 4,4-difluorobutene, 1,2-difluorobutene, 1,1-difluoro-2-butene, 1,4-difluoro-2-butene; unsaturated liner fluorohydrocarbons shown by $C_4H_5F_3$ such as 4,4,4-trifluorobutene, 3,3,4-trifluorobutene, 1,1,1-trifluoro-2-butene, 1,1,4-trifluoro-2-butene; unsaturated cyclic fluorohydrocarbons shown by $C_4H_5F$ such as 1-fluorocyclobutene, 3-fluorocyclobutene; unsaturated cyclic fluorohydrocarbons shown by $C_4H_4F_2$ such as 3,3-difluorocyclobutene, 3,4-difluorocyclobutene; unsaturated liner fluorohydrocarbons shown by $C_5H_9F$ such as 1-fluoropentene, 2-fluoropenten, 3-fluoropenten, 4-fluoropentene, 5-fluoropenten, 1-fluoro-2-pentene, 2-fluoro-2-pentene, 3-fluoro-2-pentene, 4-fluoro-2-pentene, 5-fluoro-2-pentene, 1-fluoro-2-methylbutene, 1-fluoro-3-methylbutene, 3-fluoro-2-methylbutene, 3-fluoro-3-methylbutene, 4-fluoro-2-methylbutene, 4-fluoro-3-methylbutene, 1-fluoro-2-methyl-2-butene, 1-fluoro-3-methyl-2-butene, 2-fluoro-3-methyl-2-butene, 2-(fluoromethyl)-butene; unsaturated liner fluorohydrocarbons shown by $C_5H_8F_2$ such as 3,3-difluoropentene, 4,4-difluoropentene, 5,5-difluoropentene, 1,2-difluoropentene, 3,4-difluoropentene, 3,5-difluoropentene, 4,5-difluoropentene; unsaturated cyclic fluorohydrocarbons shown by $C_5H_7F$ such as 1-fluorocyclopentene, 3-fluorocylopentene, 4-fluorocyclopentene; unsaturated cyclic fluorohydrocarbons shown by $C_5H_6F_2$ such as 3,3-difluorocyclopentene, 4,4-difluorocyclopentene, 1,3-difluorocyclopentene, 1,4-difluorocyclopentene, 3,5-difluorocyclopentene.

Additionally or alternatively, the fluorohydrocarbon gas can include one or more alkyne fluorohydrocarbon gas having the formula of $C_xH_yF_z$, wherein x is an integer selected from 3, 4, and 5, y and z are positive integers, and y is greater than z. The one or more alkyne fluorohydrocarbon gas can include, but are not limited to: unsaturated liner fluorohydrocarbon shown by $C_3H_3F$ such as 3-fluoropropyne; unsaturated liner fluorohydrocarbon shown by $C_3H_2F_2$ such as 3,3-difluoropropyne; unsaturated liner fluorohydrocarbons shown by $C_4H_5F$ such as 3-fluorobutyne, 4-fluorobutyne, 1-fluoro-2-butyne; unsaturated liner fluorohydrocarbons shown by $C_4H_4F_2$ such as 3,3-difluorobutyne, 4,4-difluorobutyne, 3,4-difluorobutyne, 1,4-difluoro-2-butyne; unsaturated liner fluorohydrocarbons shown by $C_5H_7F$ such as 3-fluoropentyne, 4-fluoropentyne, 5-fluoropentyne, 1-fluoro-2-pnetyne, 4-fluoro-2-pentyne, 5-fluoro-2-pentyne, 3-(fluoromethyl)-butyne; unsaturated liner fluorohydrocarbons shown by $C_5H_6F_2$ such as 3,3-difluoropentyne, 4,4-difluoropentyne, 5,5-difluoropentyne, 3,4-difluoropentyne, 4,5-difluoropentyne, 1,1-difluoro-2-pentyne, 4,4-difluor-2-pentyne, 5,5-difluoro-2-pentyne, 4,5-difluoro-2-pentyne, 3-(difluoromethyl)-butyne, 3-(fluoromethyl)-4-fluorobutyne.

Upon reaction with silicon in the source/drain regions 14 and silicon nitride in the cap 18, the fluorohydrocarbon-containing plasma generates a significant quantity of polymers on the top surfaces of the source/drain regions 14. The quantity of polymers on the top surfaces of the source/drain regions is significant enough to be measurable employing analytical instruments available in the art such as Auger electron spectroscopy (AES) or x-ray photoelectron spectroscopy (XPS). The thicknesses of the polymers on the top surfaces of the source/drain regions 14 can be from 0.1 nm to 3 nm depending on the process conditions employed to generate the fluorohydrocarbon-containing plasma.

Figure 2A:
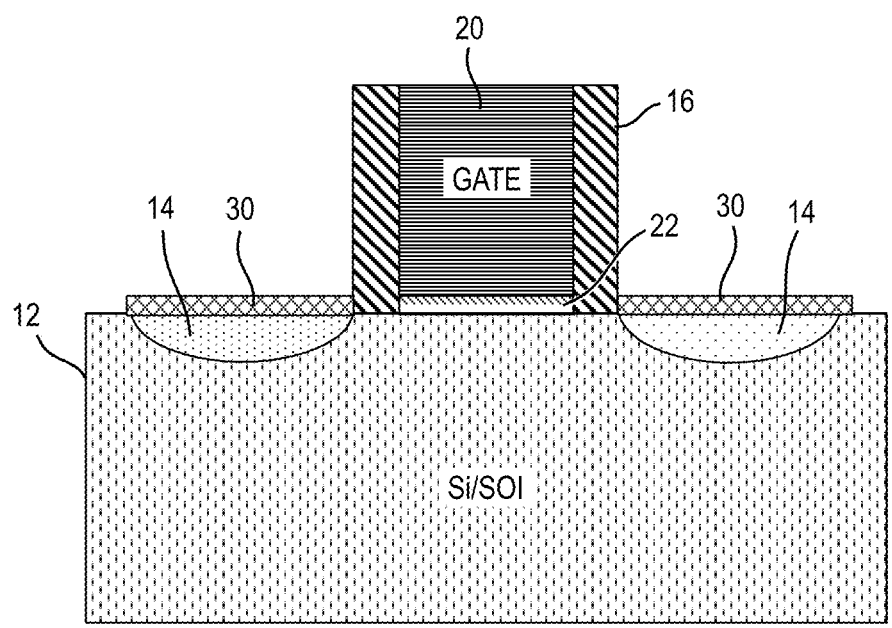
FIG. 2A is a schematic illustration of the structure of FIG. 1 following anisotropic etch.

Specifically, a first fluorohydrocarbon-containing polymer layer 30, as shown in FIG. 2A, is formed on the top surface of the source/drain regions 14 and a second fluorohydrocarbon-containing polymer (not shown) is formed on the top surfaces of the silicon nitride cap 18. The first fluorohydrocarbon-containing polymer and the second hydrocarbon-containing polymer include carbon, hydrogen, and fluorine. Further, if $O_2$ or another oxygen-containing gas is supplied into the process chamber as one of the source gases, the first fluorohydrocarbon-containing polymer and the second hydrocarbon-containing polymer include oxygen.

In one embodiment, the first fluorohydrocarbon-containing polymer layer 30 includes carbon at an atomic concentration between 30% and 40%, hydrogen at an atomic concentration between 40% and 50%, fluorine at an atomic concentration between 5.0% and 10.0%, and oxygen at an atomic concentration less than 5%. The stoichiometry of the polymer layer formed on SiGe or Si:C does not differ from that of silicon, though the deposited thickness of film may be thinner or thicker (based on condition). Silicon germanium source/drain regions employed in accordance with one or more embodiments comprise $Si_xGe_{1-x}$, where x is any value between 0 and 1. Ion Energy and process temperature are lower than those employed where the polymer layer is formed only on silicon.

The second fluorohydrocarbon-containing polymer formed on the top surface of the nitride cap 18 includes carbon, hydrogen, fluorine, optionally oxygen, and additionally includes nitrogen. Thus, the second fluorohydrocarbon-containing polymer includes a nitrogen-containing compound formed by interaction of the fluorohydrocarbon-containing plasma with the silicon nitride. The nitrogen-containing compound is a volatile compound including C, H, F, and N. As used herein, a volatile compound refers to a compound that vaporizes in vacuum at 297.3° K. Thus, the second fluorohydrocarbon-containing polymer volatilizes and is removed from the top surface of the silicon nitride cap 18 during the anisotropic etch.

The thickness of the first fluorohydrocarbon-containing polymer layer 30 on the source/drain regions 14 during a steady state of the anisotropic etch is herein referred to as a first thickness t1. As used herein, a steady state of an etch refers to a state at which the thicknesses of the etch byproducts such as polymers do not change in time. FIG. 2A schematically illustrates the structure 10 during the steady state of the anisotropic etch.

The bottom portion of the second fluorohydrocarbon-containing polymer interacts with the silicon nitride material in the silicon nitride cap 18 and subsequently volatilizes. Thus, the thickness t2 of the second fluorohydrocarbon-containing polymer on the cap 18 remains insignificant and does not impede the interaction of the fluorohydrocarbon-containing plasma with the silicon nitride material in the silicon nitride cap 18. In contrast, the first fluorohydrocarbon-containing polymer does not interact with the underlying material comprising the source/drain regions 14. Thus, the first fluorohydrocarbon-containing polymer layer 30 impedes the interaction of the fluorohydrocarbon-containing plasma with the silicon-containing source/drain regions 14. Because the first fluorohydrocarbon-containing polymer does not interact with underlying silicon-containing material comprising the source/drain regions 14, the first thickness t1 is not less than the second thickness t2 of the polymer that is formed over the cap 18.

Because the first thickness t1 is not less than the second thickness t2, the fluorohydrocarbon plasma anisotropically etches the silicon nitride comprising the cap 18 as well as the spacers 16 at an etch rate that is greater than corresponding etch rates for the source/drain regions 14. The combination of the differences between the thicknesses of the various fluorohydrocarbon-containing polymers and the reaction between the second fluorohydrocarbon-containing polymer with the underlying silicon nitride material provides high selectivity to the anisotropic etch process so that the anisotropic etch removes silicon nitride with high selectivity to the silicon-containing materials comprising the source/drain regions 14 and any other silicon-containing regions that may be exposed to the plasma during the etch process. The process is applicable to source/drain regions comprising III-V materials or any other semiconductor materials employable as source/drain regions that can benefit from the high selectivity obtained by using the disclosed process.

In one exemplary embodiment, the anisotropic etch can be employed to perform a silicon nitride etch process that is selective to silicon germanium ($Si_xGe_{1-x}$) with a high selectivity. As used herein, the selectivity of the silicon nitride etch process relative to silicon germanium is the ratio of a second etch depth d2 to a first etch depth d1, the etch depths corresponding to the amounts of material removed from the different elements of the structure 10 shown in FIG. 1. In one embodiment, the selectivity (d2/d1) of the silicon nitride etch process employing the fluorohydrocarbon-containing plasma described above relative to silicon germanium can be greater than thirty (30).

In conventional silicon nitride etch processes, the number of carbon atoms in the plasma precursor gas is less than three. Further, the number of fluorine atoms in the ions of the conventional plasma is greater than the number of hydrogen atoms in the molecules of a conventional plasma. The selectivity of the conventional silicon nitride etch process relative to silicon is provided indirectly by including hydrogen ions in the conventional plasma, which reduces the silicon etchant supply and converts the surface portion of the exposed silicon into silicon oxide and prevents further etching of silicon.

In contrast, the number of carbon ions in the molecule of the fluorohydrocarbon-containing plasma of the present disclosure is at least three (3). Further, the number of hydrogen atoms in the molecule of the fluorohydrocarbon-containing plasma is greater than the number of fluorine atoms in the molecule of the fluorohydrocarbon-containing plasma in the present disclosure. Thus, the atomic percentages of carbon and hydrogen in the first and second fluorohydrocarbon-containing polymers increase over the corresponding atomic percentages in any polymer of conventional silicon nitride etch processes. At the same time, the atomic percentage of fluorine in the first and second fluorohydrocarbon-containing polymers is less than the corresponding atomic percentage in any polymer of conventional silicon nitride etch processes. The increased carbon content and decreased fluorine content renders the first fluorohydrocarbon-containing polymer as deposited non-etchable by the fluorohydrocarbon-containing plasma given appropriate plasma conditions. However, the second fluorohydrocarbon-containing polymer is reduced by formation of a nitrogen-containing volatile compound that is formed by interaction between the second fluorohydrocarbon-containing polymer and the underlying silicon nitride material. Thus, the mechanism for providing selectivity in the silicon nitride etch relative to silicon germanium or, in another embodiment silicon carbide, is deposition of fluorohydrocarbon-containing polymer on silicon germanium or silicon carbide surfaces that is not etchable by the fluorohydrocarbon-containing plasma.

In addition to the change in the quality of the fluorohydrocarbon-containing polymer of the present disclosure relative to any polymer deposits generated in conventional silicon nitride etch processes, the amount of fluorohydrocarbon-containing polymers per unit of etching depth for a silicon nitride portion increases significantly over the amount of any polymer generated in conventional silicon nitride etch processes. The amount of any polymer, if present, in the conventional silicon nitride etch processes is typically not measurable by analytical instruments. In contrast, the amount of the first fluorohydrocarbon-containing polymer is typically measurable by analytical instruments such as an Auger electron spectrometer.

Because fluorohydrocarbon-containing polymers are generated in significant quantities in the anisotropic etch process of the present disclosure, the energy of the fluorohydrocarbon-containing plasma can be significantly lowered relative to the energy employed for conventional silicon nitride etch processes. As used herein, the quantity of the fluorohydrocarbon-containing polymers is "significant" if the fluorohydrocarbon-containing polymers are measurable by analytical equipments known in the art. Thus, the high selectivity of the silicon nitride etch process relative to silicon and silicon nitride can be employed to reduce the energy of the ions in the fluorohydrocarbon-containing plasma so that less plasma damage occurs on various physically exposed surfaces of the first exemplary structure. Reducing the energy of the ions in the fluorohydrocarbon-containing plasma decreases the total amount of polymers, i.e., the first and second fluorohydrocarbon-containing polymers that are formed during the anisotropic etch process employing the fluorohydrocarbon-containing plasma.

Ions in the fluorohydrocarbon-containing plasma can have any energy employed in conventional plasma etching of silicon nitride, which requires minimum ion energy of 200 eV in order to etch silicon nitride in any significant manner. In contrast, the ions in the fluorohydrocarbon-containing plasma can have an energy less than 200 eV. Specifically, the ions in the fluorohydrocarbon-containing plasma of the present disclosure can have an average kinetic energy between 10 eV and 1 keV. In one embodiment, the ions in the fluorohydrocarbon-containing plasma of the present disclosure can have an average kinetic energy in a range from 10 eV to 100 eV.

Figure 2B:
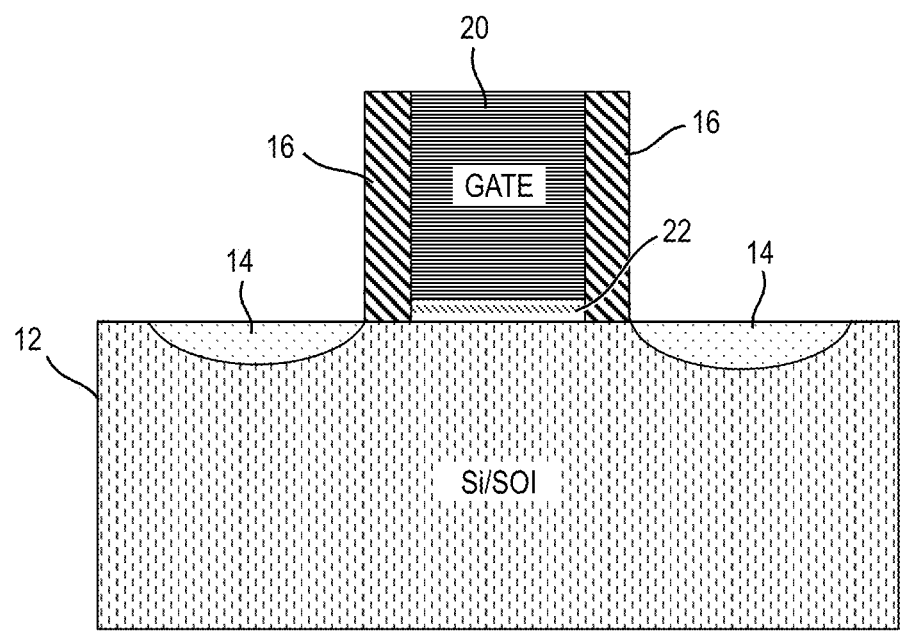
FIG. 2B is a schematic illustration of the structure of FIG. 2A following cleaning of the etched structure.

In one embodiment, the first fluorohydrocarbon-containing polymer layer 30 is not etchable with any fluorohydrocarbon-containing plasma in the absence of oxygen and at a plasma energy less than 1 keV. Once the anisotropic etch process has been completed and the structure shown in FIG. 2A has been obtained, the fluorohydrocarbon-containing polymers are cleaned, for example, by a wet clean process. In one exemplary embodiment, a remote hydrogen plasma is followed by buffered oxide etch. FIG. 2B schematically illustrates the resulting structure following removal of the polymer layers.

Figure 3:
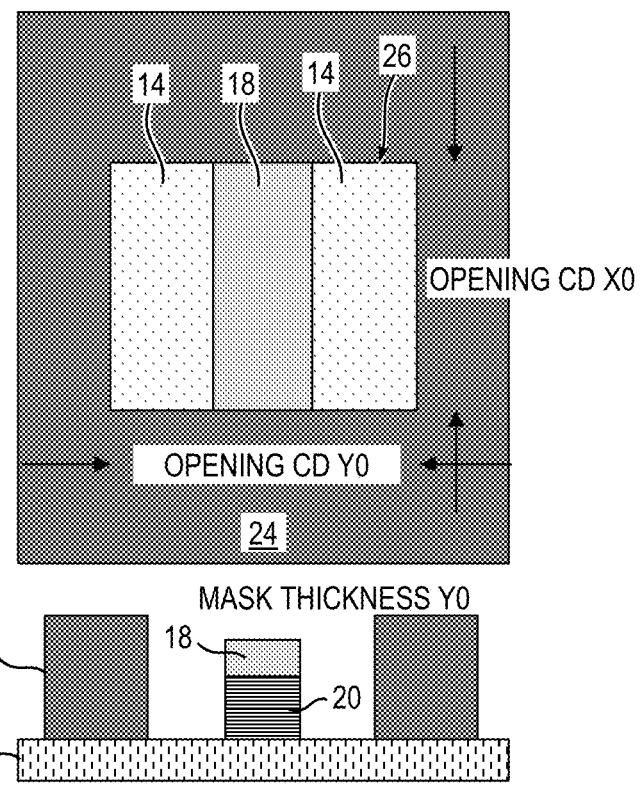
FIG. 3 is a schematic illustration including top and sectional views of a FET structure including a soft photoresist layer thereon.
Figure 4A:
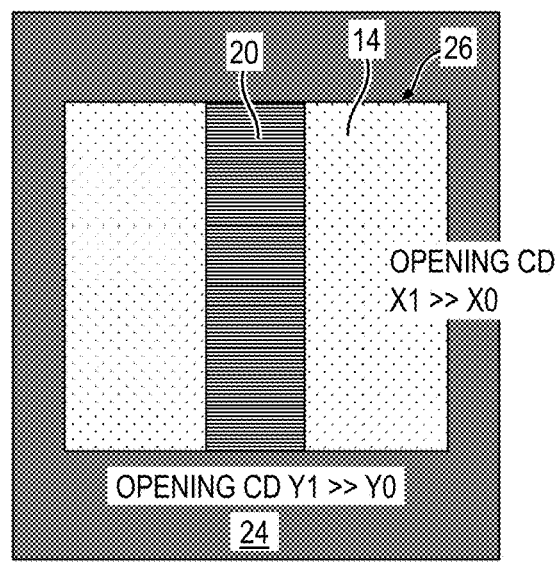
FIG. 4A is a schematic illustration the structure of FIG. 3 showing the structure of FIG. 3 following a conventional, single-carbon fluorohydrocarbon etch.
Figure 4A:
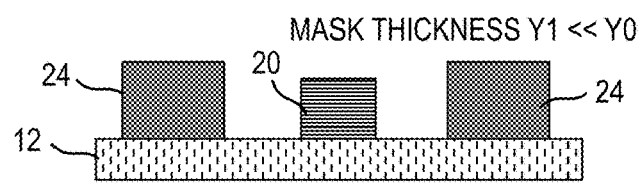
Figure 4B:
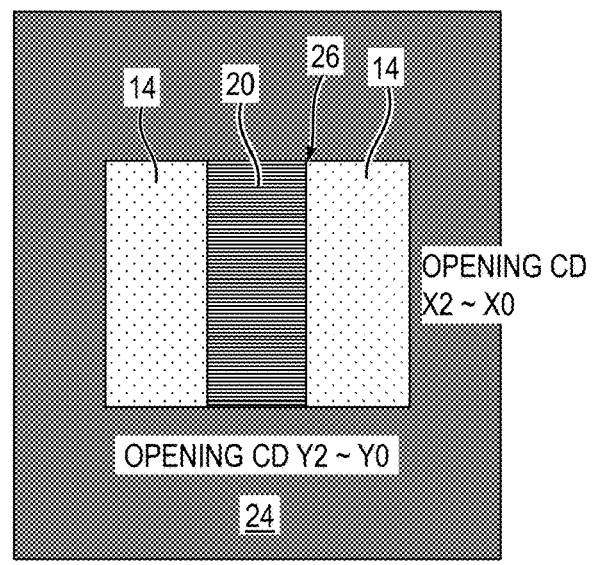
FIG. 4B is a schematic illustration of the structure of FIG. 3 following use of an anisotropic plasma etch that causes the selective deposition of a polymer layer and subsequent removal of the polymer layer.
Figure 4B:
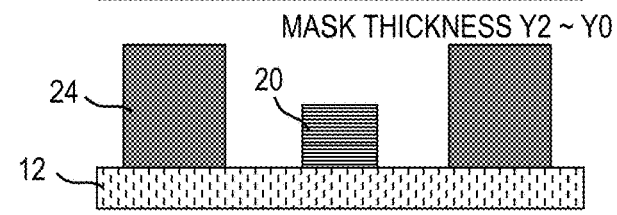

FIG. 3 schematically illustrates a starting structure similar to that shown in FIG. 1 that includes a substrate 12, a gate stack having a silicon nitride cap 18, and source/drain regions 14 operatively associated with the gate stack. The structure further includes a patterned photoresist (PR) mask 24 having an opening 26 that exposes the gate stack and source/drain regions. The PR mask or trilayer stack used is eroded during the conventional plasma due to $O_2$ admixture in the process and the typically higher amount of ion bombardment needed for selective etch. Using conventional anisotropic etch processing using single carbon $CH_xF_y$ plasma, the soft mask 24 is reduced in thickness, as shown schematically in FIG. 4A, and the dimensions of the opening 26 are enlarged. The enlarged opening 26' exposes a larger portion of the top surface of the substrate. As discussed above, the source/drain regions and gate stack may also be damaged by the anisotropic etch. In contrast, a structure as schematically illustrated in FIG. 4B is formed using the etch technology as described above with respect to FIGS. 2A and 2B. Protective polymer layers are selectively formed on both the mask 24 and the source/drain regions as the silicon nitride cap etched. Selective polymer deposition on the PR mask prevents erosion thereof (laterally and vertically). The deposit is sufficiently resistant to withstand attack from an $O_2$ admixture. As shown in FIG. 4B, the mask thickness and the dimensions of the opening 26 remain substantially the same following the anisotropic etch that removes the silicon nitride cap 18.

Figure 5:
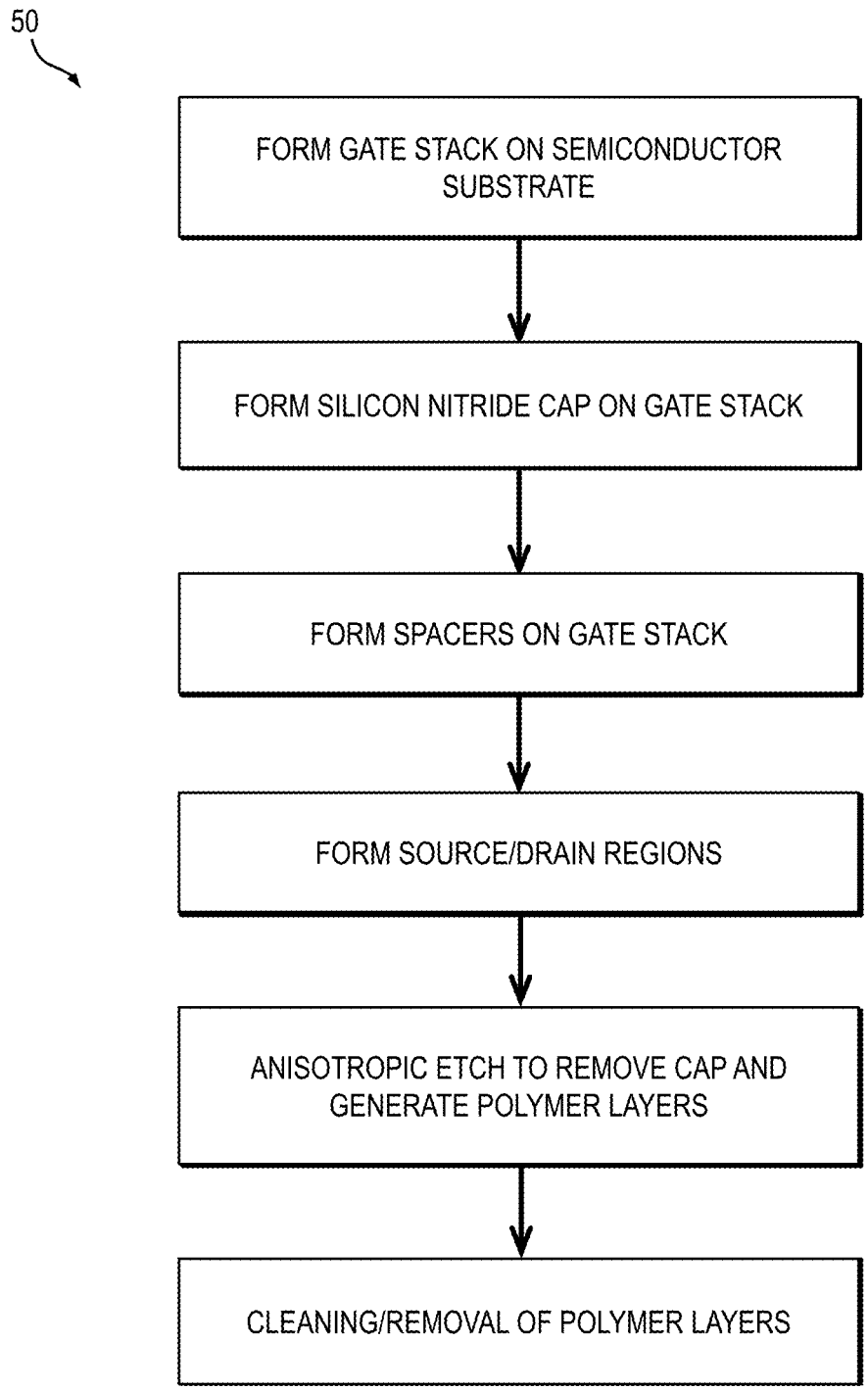
FIG. 5 is a flow chart showing an exemplary sequence of steps for fabricating a FET structure.

FIG. 5 is a flowchart showing steps that are performed in sequence in one exemplary embodiment of the method 50. A gate stack is formed on a semiconductor substrate. Semiconductor materials such as single crystal silicon form the substrate in some exemplary embodiments. In an exemplary gate-first process, gate materials may comprise a gate dielectric (for example, high-k dielectric materials such as hafnium oxide or layers of dielectric materials) and a gate conductor (e.g., metal gate). Any suitable deposition technique can be used to deposit the selected gate dielectric material(s) and electrically conductive gate materials, including but not limited to atomic layer deposition, chemical vapor deposition, physical vapor deposition, and sputtering. The deposited layers are lithographically patterned to form the stack, as known in the art. Dielectric spacers are formed around the gate stack. Such spacers can be formed by depositing a silicon nitride layer on the structure and then removing the horizontal portions of the deposited silicon nitride layer using an anisotropic etch. The anisotropic etch can be conducted using a single-carbon hydrofluorocarbon plasma or by forming a plasma from a gas comprising $C_xH_yF_z$, wherein x is an integer selected from 3, 4, 5, and 6, y and z are positive integers, and y is greater than z, as described above. Silicon nitride layers may be deposited using conventional deposition techniques such as spin-on coating, CVD, plasma-assisted CVD, or other known techniques. As indicated above, the spacers 16 in some embodiments may comprise materials other than silicon nitride or multiple layers of different materials that exhibit dielectric properties. A silicon nitride cap is formed on the gate stack prior to formation of the spacers. As shown in FIG. 1, the cap 18 may be extend at least partially above the spacers 16. The cap material is deposited before spacer formation, and as such is deposited uniformly onto the wafer and then patterned. The spacer material is deposited isotropically after the gate stack and cap are formed. Once the silicon nitride cap has been formed on the gate stack, the source/drain regions are formed. The epitaxial deposition of doped semiconductor layers is employed in one or more exemplary embodiments as at least part of the process of forming source/drain regions having conductivity types opposite to the conductivity type of the channel region beneath the gate stack. It will be appreciated that silicon nitride caps can be useful with respect to the production of devices having source/drain regions formed using other techniques such as diffusion and implantation as they facilitate separate engineering of source/drain and gate regions. In the fabrication of a pFET structure, boron-doped SiGe can be formed epitaxially on a silicon substrate in some embodiments. The doping can be chosen as desired for particular transistor applications. In one exemplary embodiment where the doped source/drain semiconductor material is SiGe, the dopant is boron in a concentration ranging 4-5e20 and the resulting FET structure is p-type. In an exemplary nFET structure, the source/drain regions comprise carbon doped silicon having a carbon doping level of about 1.5%. The formation of source/drain regions using one or more techniques is well known to those of skill in the art. Chemical vapor deposition may be employed for the epitaxial deposition of doped semiconductor layers. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. CMOS processing techniques familiar to those of skill in the art may be employed for the deposition of source and drain regions. An in situ doped epitaxial deposition process forms the source/drain regions 14 in some embodiments. A chemical vapor deposition (CVD) reactor may be used to cause the epitaxial growth of chosen materials. Rapid thermal annealing may be employed to cause diffusion of dopants into the substrate regions beneath the spacers. An anisotropic plasma etch is employed once a structure such as shown in FIG. 1 is obtained. In some embodiments, a soft mask is deposited prior to the anisotropic etch. By forming a plasma from a gas comprising $C_xH_yF_z$ as described above that causes the removal of the silicon nitride cap while selectively depositing protective polymer layers on other portions of the substrate, including the source/drain regions, the cap is removed without causing unacceptable damage to the source/drain regions. The gate stack is not damaged by this procedure. is it because a protective polymer layer is selectively deposited on the gate conductor or another non-nitride layer of the gate stack once the cap has been etched away. In embodiments including a patterned photoresist layer, the plasma etch as disclosed herein allows the dimensions of the photoresist layer to remain substantially as formed. The structure shown in FIG. 2A is obtained in some embodiments following the selective anisotropic etch. The protective polymer layers are removed to obtain a structure as shown in FIG. 2B. Further processing (not shown), including back-end-of-line (BEOL) processing follows completion of the steps shown in FIG. 5. It will be appreciated that the processing may conducted in wafer scale in some embodiments. Shallow trench isolation (STI) regions (not shown) may be formed in some embodiments by patterning techniques familiar to those skilled in the art that facilitate trench formation and subsequent filling of the trenches with one or more electrically insulating material(s) such as silicon dioxide. Shallow trench isolation (STI) provides electrical isolation of active areas of the resulting structure. The selective deposition of protective polymer layer(s) is applicable the formation of various types of devices including source/drain regions and associated gate structures, including but not limited to FinFET devices, JFETs, and bipolar devices.

Given the discussion thus far and with reference to the exemplary embodiments discussed above and the drawings, it will be appreciated that, in general terms, an exemplary fabrication method includes obtaining a FET structure comprising a semiconductor substrate, a gate stack on the substrate, source/drain regions operatively associated with the gate stack, and a silicon nitride cap of the gate stack. FIG. 1 schematically illustrates such a structure. A fluorohydrocarbon-containing plasma selective to silicon by decomposition of $C_xH_yF_z$ wherein x is an integer selected from 3, 4, 5 and 6, y and z are positive integers, and y is greater than z, is generated. The method further includes anisotropically etching the silicon nitride cap employing the fluorohydrocarbon-containing plasma to form a first hydrofluorocarbon polymer layer having a first thickness on the source/drain regions and a second hydrofluorocarbon polymer layer having a second thickness on the silicon nitride cap, the first thickness being greater than the second thickness, the second hydrofluorocarbon polymer layer further comprising a volatile nitrogen-containing compound formed by interaction of the fluorohydrocarbon-containing plasma with the silicon nitride comprising the silicon nitride cap. FIG. 2A shows the generation of the first hydrofluorocarbon polymer layer 30 on the exemplary structure. One or more embodiments of the exemplary method further include removing the first hydrofluorocarbon polymer layer from the source/drain regions. FIG. 2B shows an exemplary structure following such removal. One or more further embodiments of the method include forming a photoresist layer having a selected thickness on the FET structure and patterning the photoresist to form an opening having selected dimensions and exposing the silicon nitride cap and the source/drain regions. In embodiments including formation of a photoresist layer, the method may further include including maintaining the selected thickness and the selected dimensions of the photoresist layer during the step of anisotropically etching the silicon nitride cap, as shown schematically in FIG. 4B.

An exemplary structure provided in accordance with the disclosure includes a semiconductor substrate, a gate stack on the substrate, a channel region beneath the gate stack, spacers adjoining the gate stack, and source/drain regions operatively associated with the gate stack and channel region. A fluorohydrocarbon-containing polymer layer directly contacts and covers the top surfaces of the source/drain regions. FIG. 2A shows an exemplary structure having In one or more embodiments, the semiconductor substrate is silicon-based. In one or more embodiments, the polymer layer comprises carbon at an atomic concentration between thirty and forty percent, hydrogen at an atomic concentration between forty and fifty percent, fluorine at an atomic concentration between five and ten percent, and oxygen at an atomic concentration less than five percent. In some embodiments, the polymer layer has a thickness between 0.1 to three nanometers. A patterned photoresist layer adjoins the substrate in some embodiments. The patterned photoresist layer includes an opening in alignment with the gate stack and source/drain regions.

Those skilled in the art will appreciate that the exemplary structures discussed above can be distributed in raw form or incorporated as parts of intermediate products or end products that benefit from having FET devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
   obtaining a FET structure comprising a semiconductor substrate, a gate stack on the substrate, silicon nitride spacers adjoining the gate stack, source/drain regions operatively associated with the gate stack and having exposed top surfaces, and a silicon nitride cap on the gate stack;
   forming a soft mask having a selected thickness on the FET structure;
   patterning the soft mask to form an opening having selected dimensions and exposing the silicon nitride cap and the source/drain regions;
   generating a fluorohydrocarbon-containing plasma selective to silicon by decomposition of $C_xH_yF_z$ wherein x is an integer selected from 3, 4, 5 and 6, y and z are positive integers, and y is greater than z, and
   anisotropically etching the silicon nitride cap and spacers employing the fluorohydrocarbon-containing plasma thereby causing removal of the silicon nitride cap and forming:
      a first hydrofluorocarbon polymer layer having a first thickness on the exposed top surfaces of the source/drain regions,
      a second hydrofluorocarbon polymer layer having a second thickness on the silicon nitride cap, the first thickness being greater than the second thickness, the second hydrofluorocarbon polymer layer further comprising a volatile nitrogen-containing compound formed by interaction of the fluorohydrocarbon-containing plasma with the silicon nitride comprising the silicon nitride cap,
      a third hydrofluorocarbon polymer layer on the gate stack subsequent to removal of the silicon nitride cap, and
      a fourth hydrofluorocarbon polymer layer on the soft mask,
   wherein the selected thickness of the mask and the selected dimensions of the opening remain substantially the same following anisotropically etching the silicon nitride cap.

2. The method of claim 1, wherein the silicon nitride cap of the FET structure extends above the spacers.

* * * * *